(12) United States Patent
Wells et al.

(10) Patent No.: US 7,776,715 B2
(45) Date of Patent: Aug. 17, 2010

(54) REVERSE CONSTRUCTION MEMORY CELL

(75) Inventors: David H. Wells, Boise, ID (US); H. Montgomery Manning, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 1124 days.

(21) Appl. No.: 11/189,945

(22) Filed: Jul. 26, 2005

(65) Prior Publication Data

US 2007/0023805 A1 Feb. 1, 2007

(51) Int. Cl.
*H01L 21/46* (2006.01)

(52) U.S. Cl. .............. 438/455; 438/456; 438/457; 438/458; 438/459; 438/460; 438/463; 438/405; 438/406; 438/424; 438/427; 438/294; 438/295; 438/296; 257/E21.519; 257/E21.567; 257/E21.601

(58) Field of Classification Search ......... 438/455–460, 438/463, 405–406, 424, 427, 294–296, 396
See application file for complete search history.

(56) References Cited

U.S. PATENT DOCUMENTS

| 5,563,084 | A | 10/1996 | Ramm et al. |
|---|---|---|---|
| 5,849,624 | A | 12/1998 | Fazan et al. |
| 6,171,925 | B1 | 1/2001 | Graettinger et al. |
| 6,184,111 | B1 | 2/2001 | Henley et al. |
| 6,290,804 | B1 | 9/2001 | Henley et al. |
| 6,300,227 | B1 | 10/2001 | Liu et al. |
| 6,355,501 | B1 | 3/2002 | Fung et al. |
| 6,391,735 | B1 | 5/2002 | Durcan et al. |
| 6,429,074 | B2 | 8/2002 | Lee et al. |
| 6,537,870 | B1 | 3/2003 | Shen |
| 6,600,173 | B2 | 7/2003 | Tiwari |
| 6,635,552 | B1 | 10/2003 | Gonzalez |
| 6,734,482 | B1 | 5/2004 | Tran et al. |
| 6,753,565 | B1 | 6/2004 | Durcan et al. |
| 6,756,625 | B2 | 6/2004 | Brown |
| 6,790,747 | B2 | 9/2004 | Henley et al. |
| 6,861,302 | B2 * | 3/2005 | Dai .............................. 438/166 |
| 6,903,419 | B2 * | 6/2005 | Ohsawa ....................... 257/347 |
| 7,052,941 | B2 * | 5/2006 | Lee ............................. 438/152 |

(Continued)

OTHER PUBLICATIONS

Chuang et al., "SOI for digital CMOS VLSI: design considerations and advances", Proceedings of the IEEE, vol. 86, No. 4, pp. 687-720 (Apr. 1998).

(Continued)

*Primary Examiner*—Lynne A Gurley
*Assistant Examiner*—Samuel A Gebremariam
(74) *Attorney, Agent, or Firm*—Knobbe, Martens, Olson & Bear, LLP

(57) ABSTRACT

A method of fabricating a memory cell comprises forming a plurality of doped semiconductor layers on a carrier substrate. The method further comprises forming a plurality of digit lines separated by an insulating material. The digit lines are arrayed over the doped semiconductor layers. The method further comprises etching a plurality of trenches into the doped semiconductor layers. The method further comprises depositing an insulating material into the plurality of trenches to form a plurality of electrically isolated transistor pillars. The method further comprises bonding at least a portion of the structure formed on the carrier substrate to a host substrate. The method further comprises separating the carrier substrate from the host substrate.

20 Claims, 14 Drawing Sheets

U.S. PATENT DOCUMENTS

| | | | |
|---|---|---|---|
| 7,078,315 B2 * | 7/2006 | Chang et al. | 438/435 |
| 7,229,895 B2 | 6/2007 | Wells | |
| 7,285,812 B2 | 10/2007 | Tang et al. | |
| 7,368,365 B2 | 5/2008 | Wells | |
| 2003/0230783 A1 | 12/2003 | Willer et al. | |
| 2005/0035392 A1 | 2/2005 | Coursey | |
| 2005/0145913 A1 | 7/2005 | Katsumata et al. | |
| 2006/0258118 A1 | 11/2006 | Wells | |
| 2008/0073687 A1 | 3/2008 | Wells | |

OTHER PUBLICATIONS

Fishburn et al., "A 78 nm $6F^2$ DRAM technology for multigigabit densities", 2004 Symposium on VLSI Technology Digest of Technical Papers, pp. 28-29 (2004).

Kim et al., "A study on selective $Si_{0.8}Ge_{0.2}$ etch using polysilicon etchant diluted by $H_2O$ for three-dimensional Si structure application", Electrochemical Society Proceedings, vol. 2003-05, pp. 81-86 (2003).

Lee et al., "A novel pattern transfer process for bonded SOI giga-bit DRAMs", Proceedings 1996 IEEE International SOI Conference, pp. 114-115 (Oct. 1996).

Mazuré et al., "Advanced SOI substrate manufacturing", 2004 IEEE International Conference on Integrated Circuit Design and Technology, pp. 105-111 (2004).

Nakamura et al., "Giga-bit DRAM cells with low capacitance and low resistance bit-lines on buried MOSFET's and capacitors by using bonded SOI technology", IEDM 95-889 through 95-892 (1995).

Tong et al., "Science and Technology of Semiconductor Wafer Bonding", Chapter 11, pp. 233-261, published by John Wiley and Sons (1999).

Wittkower et al., "Smart-Cut® technology for SOI: a new high volume application for ion implantation", pp. 269-272 (2000).

Silicon Genesis Corporation, "Ultra-thin SOI wafer fabrication technologies for fully-depleted CMOS", Technical Bulletin (May 2002).

U.S. Appl. No. 10/934,621, filed Sep. 2, 2004.

U.S. Appl. No. 11/021,639, filed Dec. 22, 2004.

U.S. Appl. No. 11/036,163, filed Jan. 14, 2005.

* cited by examiner

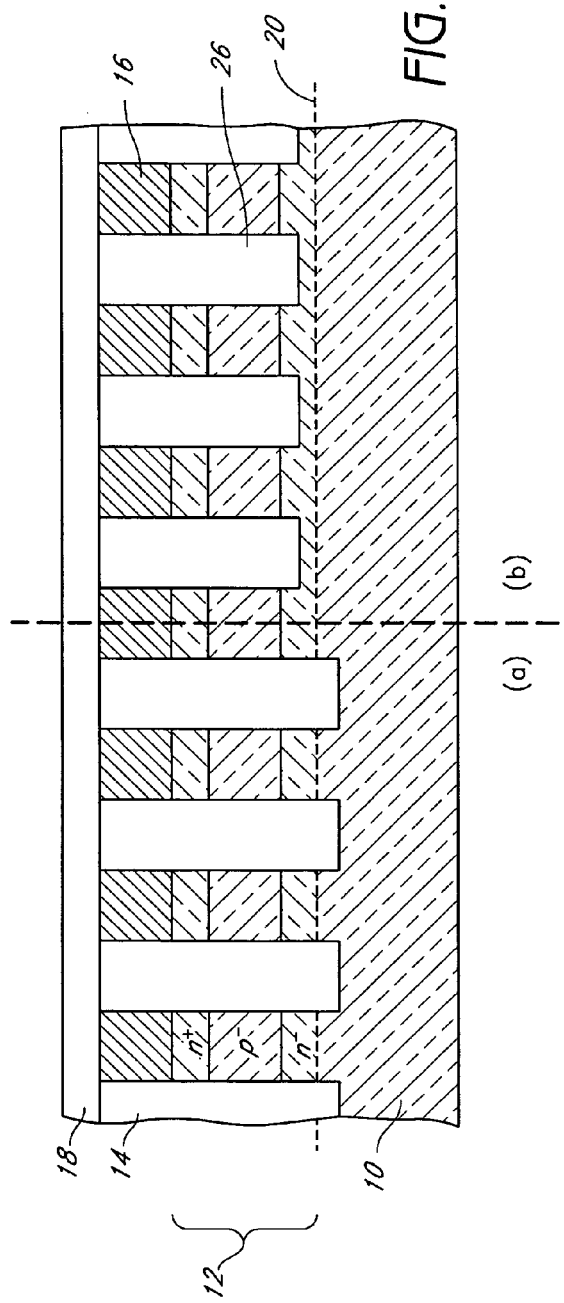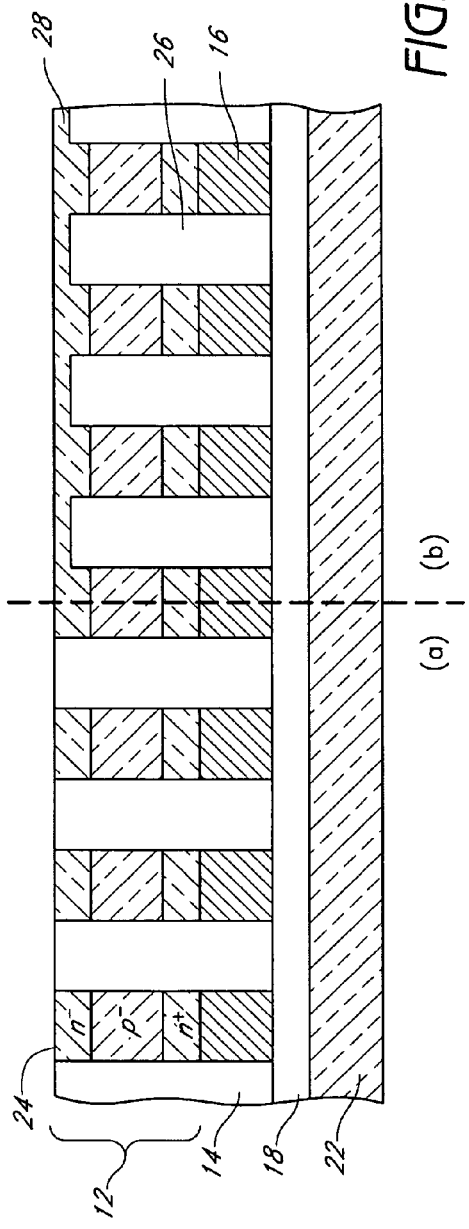

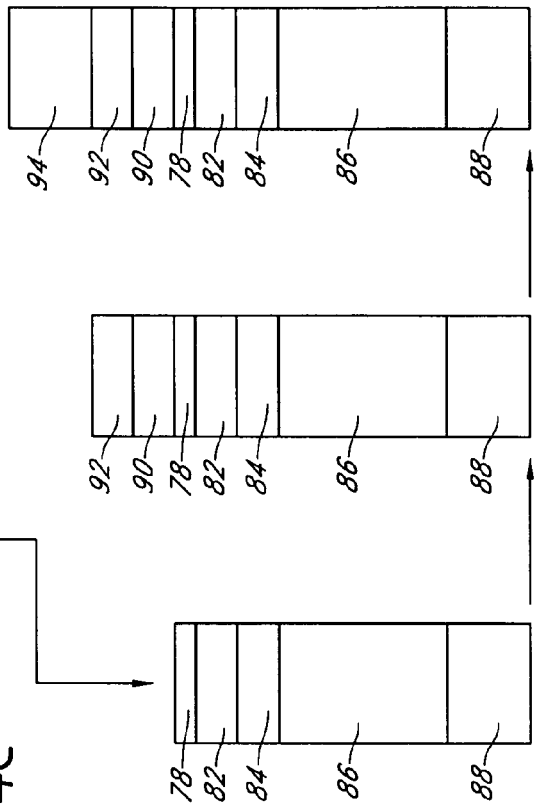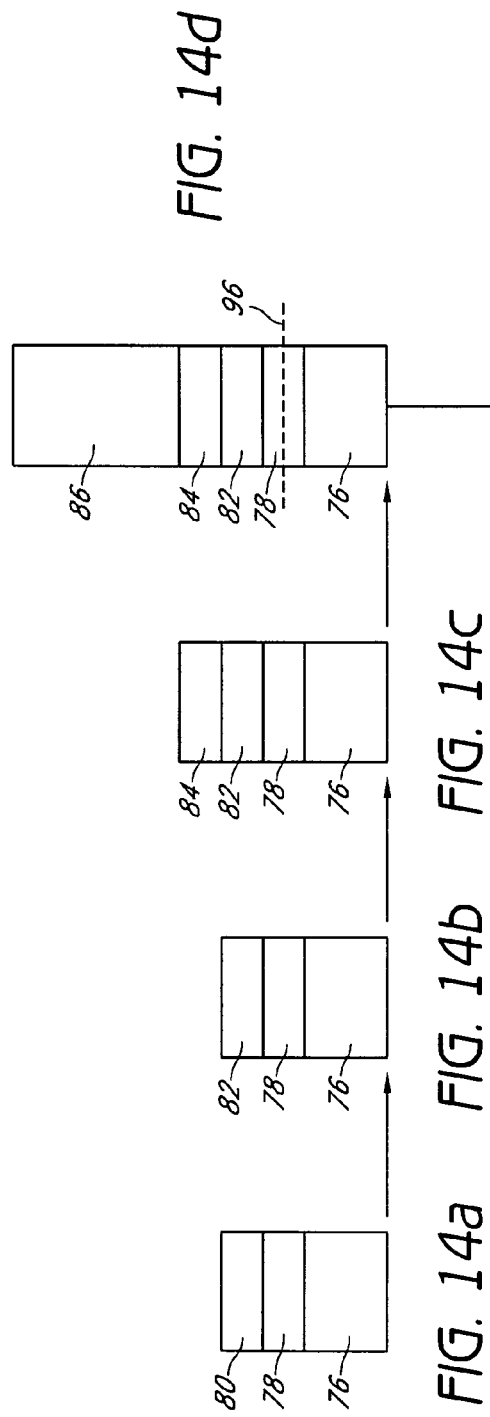

REVERSE CONSTRUCTION MEMORY CELL

REFERENCE TO RELATED APPLICATIONS

This application is related to U.S. patent application Ser. No. 10/934,621 (filed 2 Sep. 2004) and U.S. patent application Ser. No. 11/036,163 (filed 14 Jan. 2005). The entire content of these related applications is hereby incorporated by reference herein.

FIELD OF THE INVENTION

The present invention relates generally to integrated circuit fabrication, and more specifically to fabrication of memory cell arrays.

BACKGROUND OF THE INVENTION

Electronic storage devices are a key component for data retention in digital computing devices. Conventional semiconductor electronic storage devices, such as dynamic random access memory (DRAM) devices, include large numbers of capacitor and transistor structures that are grouped into memory cells in pairs. The capacitors in such devices, which are typically arranged in densely packed arrays to provide reduced device size and easy electrical interconnection, are used to temporarily store data based on their charged state. The memory cells that comprise a DRAM device are arranged into larger memory arrays.

The memory cells of a DRAM memory array are individually addressable via a word line and a digit line—one of which addresses a "column" of memory cells in the array, while the other addresses a "row" of memory cells in the array. In many DRAM devices, the digit line is buried below the capacitors, often below the upper level of the substrate on which the memory device is formed. For example, in once configuration, the digit line is buried within the isolation trench used for electrical separation of adjacent transistors.

To increase efficiency and reduce size of memory devices, significant resources have been devoted to the creation of smaller memory cells (that is, memory cells that occupy less "real estate"). The size of individual DRAM cells can be reduced in several ways. One way is to reduce the minimum size of the components, or "features", that form the memory device. Decreasing the dimension of the minimum feature size F for a given manufacturing process generally occurs through the use of new and advanced lithography and etching techniques, such as through the use of "pitch doubling" techniques. Another way to reduce the size of individual DRAM cells is to design a smaller memory cell. Currently, commercially available DRAM chips have a memory cells size of 8 $F^2$ or greater. U.S. Pat. No. 6,734,482 (issued 11 May 2004) describes a DRAM memory cell with a buried digit line that has a size 6 $F^2$.

Vertical transistor designs are also used to decrease the size of memory devices. An example of a memory device using a vertical transistor is disclosed in U.S. Pat. No. 6,756,625 (issued 29 Jun. 2004), the entire disclosure of which is hereby incorporated by reference herein. In this design, the digit line is directly connected to a pillar used to form the vertical transistor.

SUMMARY OF THE INVENTION

In accordance with the foregoing, improved memory cells have been developed. For example, certain embodiments of the improved memory cells disclosed herein provide reduced footprint and improved structural integrity. Additionally, certain embodiments provide improved electrical properties such as digit lines with reduced capacitance and/or reduced resistance, as well as digit lines formed from temperature-sensitive materials.

In one embodiment of the present invention, a method of fabricating a memory cell comprises forming a plurality of doped semiconductor layers on a carrier substrate. The method further comprises forming a plurality of digit lines separated by an insulating material. The digit lines are arrayed over the doped semiconductor layers. The method further comprises etching a plurality of trenches into the doped semiconductor layers. The method further comprises depositing an insulating material into the plurality of trenches to form a plurality of electrically isolated transistor pillars. The method further comprises bonding at least a portion of the structure formed on the carrier substrate to a host substrate. The method further comprises separating the carrier substrate from the host substrate.

In another embodiment of the present invention, a method comprises forming a plurality of at least partially fabricated transistor structures on a carrier substrate. The method further comprises forming a plurality of digit lines over the at least partially fabricated transistor structures. The method further comprises separating the digit lines and the at least partially fabricated transistor structures from the carrier substrate. The method further comprises bonding the digit lines and the at least partially fabricated transistor structures to a host substrate. The digit lines are positioned between the host substrate and the at least partially fabricated transistor structures.

In another embodiment of the present invention, a semiconductor device comprises a substrate. The semiconductor device further comprises a plurality of buried digit lines spaced apart from each other by a plurality of oxide regions. The semiconductor device further comprises a transistor device including a plurality of doped semiconductor layers. The transistor device contacts a selected one of the buried digit lines. The selected buried digit line is positioned between the transistor device and the substrate.

In another embodiment of the present invention, an integrated circuit comprises a substrate. The integrated circuit further comprises a transistor device. The integrated circuit further comprises a double-sided capacitor positioned between the substrate and the transistor device. The integrated circuit further comprises a digit line separated from the transistor device by an insulator layer. A via is formed through the insulator layer to provide an electrical connection between the digit line and the transistor device.

In another embodiment of the present invention, a method comprises providing a region of doped semiconductor material on a carrier substrate. The method further comprises forming a plurality of transistor devices in the region of doped semiconductor material. The method further comprises forming a capacitor device over at least one of the transistor devices. The capacitor device has a bottom electrode with an inner surface and an outer surface, a capacitor dielectric, and a upper electrode. The capacitor dielectric and the upper electrode extend over each of the inner surface and the outer surface of the bottom electrode. The method further comprises bonding a host substrate to the capacitor device. The method further comprises separating the carrier substrate from at least one of the transistor devices. The method further comprises depositing a conductive digit line over at least one of the transistor devices. The method further comprises providing an electrical connection between the conductive digit line and at least one of the transistor devices.

In another embodiment of the present invention, a method comprises providing a region of doped semiconductor material on a carrier substrate. The method further comprises forming a plurality of transistor devices in the region of doped semiconductor material. The method further comprises forming a capacitor device over at least one of the transistor devices. The capacitor device has an inner electrode that is electrically connected to at least one of the transistor devices and an outer electrode that is separated from the inner electrode by a dielectric material. The inner electrode has at least three distinct electrode surfaces that are parallel to each other. The method further comprises bonding a host substrate to the capacitor device. The method further comprises separating the carrier substrate from at least one of the transistor devices. The method further comprises depositing a conductive digit line over at least one of the transistor devices. The method further comprises providing an electrical connection between the conductive digit line and at least one of the transistor devices.

BRIEF DESCRIPTION OF THE DRAWINGS

Exemplary embodiments of the improved memory cell configurations and fabrication techniques are illustrated in the accompanying drawings, which are for illustrative purposes only. The drawings comprise the following figures, in which like numerals indicate like parts.

FIG. 3 is a cross-sectional view of two exemplary embodiments of a partially formed integrated circuit comprising a plurality of transistor pillars formed over a carrier substrate. The transistor pillars are separated by oxide-filled trenches that extend to a depth below a separation line in region (a), and that extend to a depth above a separation line in region (b).

FIG. 4 is a cross-sectional view of the exemplary embodiments of FIG. 3 after transferring the transistor pillars to a host substrate.

FIGS. 14A through 14G are schematic representations of an alternative process flow used to form a buried capacitor memory cell.

DETAILED DESCRIPTION OF PREFERRED EMBODIMENTS

Figure 2:
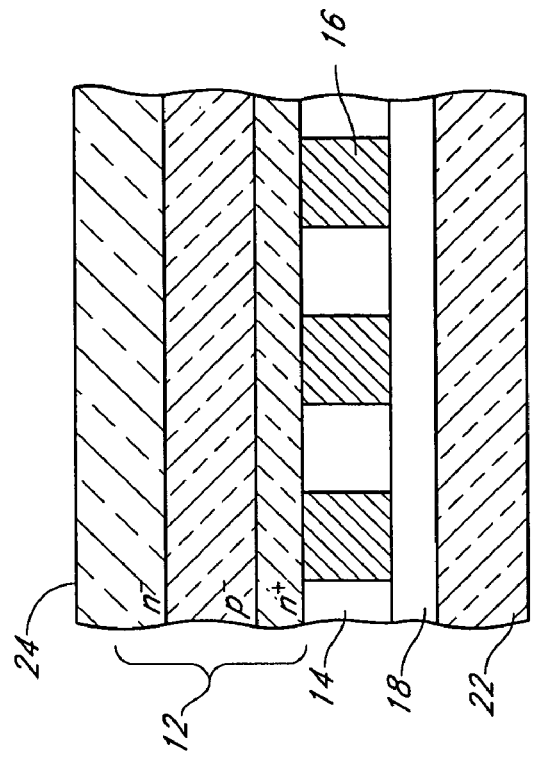
FIG. 2 is a cross-sectional view of an exemplary embodiment of a partially formed integrated circuit comprising the active regions of FIG. 1 after having been transferred to a host substrate.

As used herein, the term "semiconductor substrate" means, in addition to its ordinary meaning, a construction comprising semiconductor materials, including but not limited to, bulk semiconductor materials such as semiconductor wafers and semiconductor material layers. As used herein, the term "substrate" means, in addition to its ordinary meaning, a supporting substrate, including but not limited to semiconductor substrates, ether alone or in assemblies comprising other materials formed thereon. As used herein, the term "layer" encompasses both the singular and plural, unless otherwise indicated.

DRAM Pillar Formed Using Pattern Transfer Technique.

As described herein, use of a vertical transistor configuration with a buried digit line allows smaller memory cells to be constructed, including memory cells as small as 6 $F^2$ or even 4 $F^2$. Typically, a buried digit line is formed in a trench that has been etched into a substrate using a photolithography technique. A spacer is applied to the walls of the trench to insulate the buried digit line. Therefore, because of the presence of the spacer material on the trench walls, the maximum dimension of the digit line is significantly less than the minimum feature size attainable using the photolithography technique. This disadvantageously increases the resistance and the capacitance of the digit line. This also disadvantageously increases the aspect ratio of the digit line, thus compromising the digit line structural integrity and rendering it susceptible to voids during fabrication and electromigration during operation.

Furthermore, formation of subsequent memory cells structures above a buried digit line presents significant challenges, particularly with respect to protecting the buried digit line from damage caused by subsequent high temperature processing steps. For example, high temperature processing steps are often employed in doping layers for the transistors, and in the formation of certain high dielectric constant materials ("high k materials") that are commonly used in capacitors and/or transistors formed over the buried digit line. The transistor structure of a vertical memory cell is also referred to herein as the memory cell "access device" and capacitors are also referred to herein as the memory cell "storage device".

Disclosed herein are improved memory cells and memory cell fabrication techniques. In an exemplary embodiment, the buried digit line of a memory cell is protected from subsequent high temperature processing steps by forming the memory cell structure in an inverted (that is, upside down) orientation on a carrier substrate. This allows the "buried" digit line to be formed after high-temperature processing steps used in the fabrication of other memory cell components, such as the access device. This sequence also allows the digit line to be aligned under the transistor to maximize volume available for the bitline without intruding into the field isolation between transistors. Then, after the access device and the digit line are formed, a pattern transfer technique (also referred to as a layer transfer technique) is used to remove the partially formed, inverted memory cell from the carrier substrate and place it in the correct (that is, right-side-up) orientation on a host substrate. In one embodiment, SMART-CUT® technology is used to perform the pattern transfer technique. Subsequent processing steps are then conducted to form further memory cell components, such as capacitor and metallization layers. Typically, capacitor and metallization layers formed in relatively low temperature processes, and are therefore unlikely to adversely affect the buried digit line or the interface between the buried digit line and the access device.

The fabrication techniques disclosed herein advantageously allow $4 F^2$ memory cells to be constructed. The digit lines formed using the techniques disclosed herein have a feature size that is not less than the minimum photolithographic feature size, thereby providing the digit lines with improved electrical and structural properties, such as reduced parasitic capacitance, reduced resistance, reduced aspect ratio, and increased structural integrity.

Figure 1:
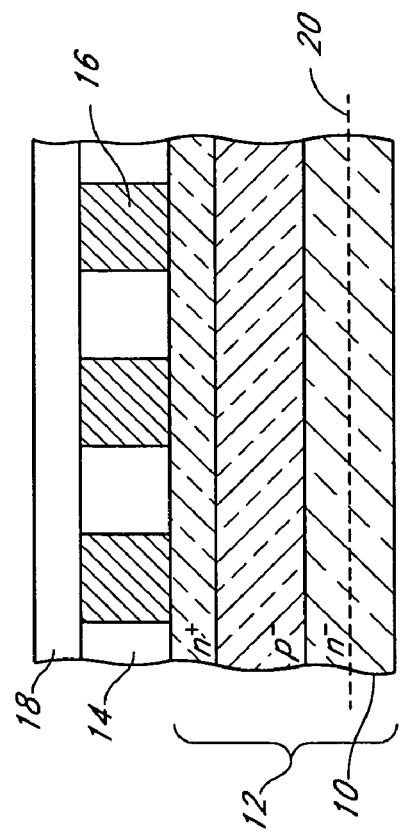
FIG. 1 is a cross-sectional view of an exemplary embodiment of a partially formed integrated circuit comprising a plurality of active regions formed over a carrier substrate.

FIG. 1 illustrates an exemplary embodiment in which a plurality of doped silicon layers 12 are formed on the surface of a carrier substrate 10. The doped silicon layers 12 will eventually comprise the source, drain and vertical channel regions for the memory cell transistor device. Therefore, appropriate dopants and dopant concentrations are selected based on the transistor characteristics sought for a particular application. FIG. 1 illustrates an exemplary configuration of doped silicon layers, although other configurations are used in other embodiments.

Still referring to FIG. 1, a first oxide layer 14 is formed over the doped silicon layers 12, and a plurality of conductive digit lines 16 are formed in the first oxide layer. In an exemplary embodiment, the digit lines 16 are formed by selectively etching trenches in the first oxide layer 14 followed by a damascene process to fill the trenches with a conductive material. In such embodiments, the pattern of trenches is formed using a photolithography technique, such that the feature size of the trenches corresponds to the resolution of the photolithography technique. For example, in one embodiment a photolithography technique capable of resolving features as small as between about 50 µm and about 150 µm is used. Other methods for forming the digit lines 16 are used in other embodiments. Optionally, a second oxide layer 18 is formed over the digit lines 16. Alternatively, the digit lines can be formed by blanket deposition, conventional patterning and etching, with an insulating layer deposited over and between the digit lines.

After the structure illustrated in FIG. 1 is formed, a pattern transfer technique is used to transfer the doped silicon layers, the oxide layers, and the digit lines (collectively referred to as the transferred layers) to a silicon host substrate. In an exemplary embodiment, hydrogen ions are implanted to define the separation line 20, optionally before forming the digit line, as discussed in greater detail below. In one embodiment, the pattern transfer technique comprises inverting the structure illustrated in FIG. 1, bonding the second oxide layer 18 to the host substrate, and separating the carrier substrate 10 along a separation line 20. The resulting structure is illustrated in FIG. 2, which shows the transferred layers positioned over a silicon host substrate 22. Optionally, the exposed surface 24 of the transferred layers is planarized using a chemical mechanical planarization (CMP) process to remove damage from the implantation and separation processes. Once the structure illustrated in FIG. 2 is formed, individual transistor devices are formed by etching a pattern through the active regions to form exposed pillars. In such embodiments, gates are then formed around the exposed pillars.

A variety of different techniques can be used to separate the carrier substrate 10 from the active regions along the separation line 20. For example, in one embodiment, a hydrogen ions are implanted at an appropriate level within the doped silicon layers, wherein the implantation depth is determined by adjusting the implantation energy. Implantation of hydrogen ions weakens the structure of the doped silicon, thereby allowing the active layers to be separated from the carrier substrate. In an exemplary embodiment, the hydrogen ions are implanted before forming the digit lines 16, while in other embodiments the hydrogen ions are implanted after the second oxide layer 18 is formed over the digit lines 16.

After the pattern transfer technique is performed, resulting in the structure illustrated in FIG. 2, pillar transistor structures are defined. Exemplary pillar transistor structures are illustrated in FIGS. 3 and 4, which are discussed in greater detail below. After the pillar transistor structures are defined, other devices are optionally formed thereover, such as capacitors and other metallization layers which are used to complete the circuit.

In certain modified embodiments, a pattern of trenches is etched through the active regions to form separated transistor pillars before performing the pattern transfer technique. Two such embodiments are illustrated in FIG. 3, which shows the transistor pillars separated by oxide-filled trenches 26. In one embodiment, illustrated in region (a) of FIG. 3, the trenches 26 are etched to a depth below the separation line 20, which causes the transistor pillars to be separated after the pattern transfer technique is performed. In an alternative embodiment, illustrated in region (b) of FIG. 3, the trenches 26 are etched to a depth above the separation line 20, thereby causing a blanket silicon layer to exist over the transistor pillars after the pattern transfer technique is performed. FIG. 4 illustrates the partially formed integrated circuits of FIG. 3 after the pattern transfer technique has been performed. A blanket silicon layer 28 is present over the oxide-filled trenches in region (b).

As illustrated in the Figures, certain embodiments disclosed herein provide a buried digit line having a feature size F that is formed in an oxide layer. This is a significant improvement over conventional techniques for forming buried digit lines, which generally involve lining a trench of feature size F with a thin oxide layer, followed by forming the buried digit line in the oxide-lined trench. Such prior art systems result in a buried digit line smaller than feature size F—due to the presence of the oxide lining in the trench which is used to isolate the digit line from the substrate—thereby increasing resistance of the digit line and decreasing structural stability of the digit line. Certain disclosed embodiments also advantageously provide improved alignment between the buried digit line and the transistor pillar, thus addressing the alignment difficulties common in prior art memory cell fabrication techniques. In embodiments where pitch multiplication is used to from a buried digit line, certain of the techniques disclosed herein allow a buried digit line having a feature size of ½F to be formed, whereas conventional techniques that use an oxide liner produce a buried digit line having a feature size of less than ½F to be formed.

Figure 5:
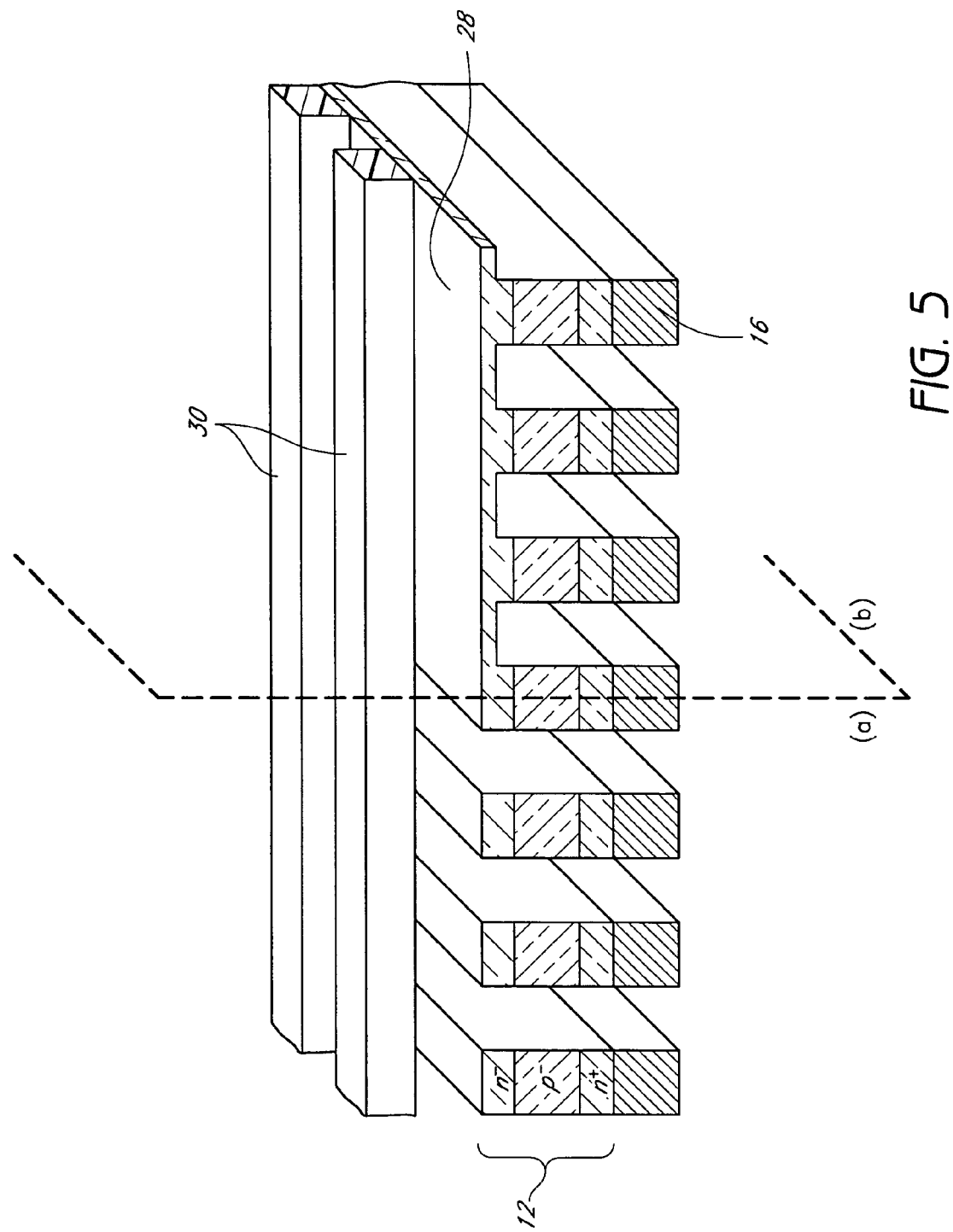
FIG. 5 is a perspective view of the partially-formed integrated circuit of FIG. 4 after forming a photoresist pattern thereover, wherein the photoresist pattern is used to separate transistors along a line and define the spaces in which a plurality of word lines can be formed.

In an exemplary embodiment, illustrated in FIG. 5, after performing the pattern transfer technique, a plurality of mask lines 30 are formed over and orthogonal to the digit lines 16. In FIG. 5, the host substrate and the oxide layers are not shown for purposes of clarity. In one embodiment, the mask lines 30 are formed using a photolithographic technique. The mask lines 30 are used to separate the transistor pillars from each other. In embodiments wherein the oxide-filled trenches 26 are etched to a depth above the separation line 20, such as illustrated in region (b) of FIGS. 3 and 4, the resulting blanket silicon layer 28 functions as a hard mask for a subsequent word line trench etch. After separating the pillars, the word lines are then deposited by lining the pillars and the remaining oxide 26 between the pillars with a conductive material such as doped polycrystalline silicon. This is followed by a spacer etch which is used to separate the word lines from each other, and subsequent formation of other circuit features, such as capacitors or metallization layers.

In a modified embodiment, an oxide etch is performed after forming the mask lines 30. This is followed by blanket deposition of a gate material that surrounds the transistor pillars, and deposition of a mask to separate the word lines, which are oriented perpendicular to the bit lines. The word lines can then be recessed, before or after performed another etch.

As illustrated in the exemplary embodiment of FIG. 3, a plurality of oxide-filled trenches 26 are formed before performing the pattern transfer technique. In a modified embodiment, individual device pillars are formed before performing the pattern transfer technique. As described herein, the embodiment illustrated in FIG. 3 comprises etching a first set of grooves into the doped silicon layers 12 to a depth either above or below the separation line 20. In a modified embodiment wherein individual device pillars are formed before performing the pattern transfer technique, a second set of grooves orthogonal to the first set of grooves are etched into the doped silicon layers 12 to a depth either above or below the separation line 20. In such embodiments, these grooves are filled with oxide and planarized back to the pillar tops. In embodiments wherein individual device pillars are formed before conducting the pattern transfer technique, the number of post-transfer processing steps is reduced. For example, in one embodiment only the word lines are formed after performing the pattern transfer technique.

Suitable techniques for filing trenches between device pillars include spin-on dielectric processes, high density plasma processes, atomic layer deposition processes, or a combination of the above. Additionally, a pitch multiplication technique is optionally used to form either the digit line grooves, the word line grooves, or both. Use of a pitch multiplication technique advantageously provides additional dimensional control for the digit and/or word lines, which is particularly important as these devices become fully depleted.

In an exemplary embodiment, the digit lines 16 comprise a conductive material, such as a metal. Examples of such materials include, but are not limited to $WSi_x$, W, and refractory silicide. In certain modified embodiments, a barrier, such as a TiN, WN, or TaN barrier, is included to reduce oxidation of the digit line, or to reduce excessive reaction with silicon.

In certain embodiments, peripheral devices such as sense amplifiers and/or other logic circuitry are formed outside the array. For example, in one embodiment, peripheral devices are formed on the host wafer before or after performing the pattern transfer technique. In such embodiments, the peripheral devices are formed in an inverted configuration by removing the oxide layers in the periphery region after the pattern transfer technique to reach the doped single crystal silicon layers. In yet another embodiment, peripheral devices are formed on the host substrate before performing the pattern transfer technique. In such embodiment, the peripheral devices are formed in the single-crystal silicon of the host substrate, and an alignment mechanism is used to prevent the device pillars from being positioned on top of the peripheral devices when the pattern transfer technique is performed.

Reverse Trench Capacitor DRAM Cell.

In another embodiment, a DRAM cell having a buried capacitor is formed using a wafer transfer technique. In such embodiments, a transistor array and overlying stacked capacitor is constructed over a carrier substrate. Advantageously, because the capacitor is formed over the substrate, complicated high surface area structures can be formed, as compared to traditional trench structures. For example, in the embodiment illustrated in FIG. 13, and discussed in greater detail below, a double-sided container capacitor is formed, with both inner and outer surfaces contributing to the capacitance. This structure is then inverted and transferred to a host substrate, such that the capacitor is buried below the transistors. This facilitates formation of digit lines on the overlying planar region formed during separation from the carrier wafer. More generally, this process advantageously allows a double-sided, high dielectric constant ("high-k") capacitor to be formed using standard processing paradigms. Such a capacitor facilitates formation of high-density vertical pillar transistors, such as used in a $8 F^2$, $6 F^2$, $4.5 F^2$, or $4 F^2$ memory cell. The sequence also facilitates integration of digit lines over pitch doubled transistors because the capacitor structures can be buried without sacrificing capacitance.

Figure 6:
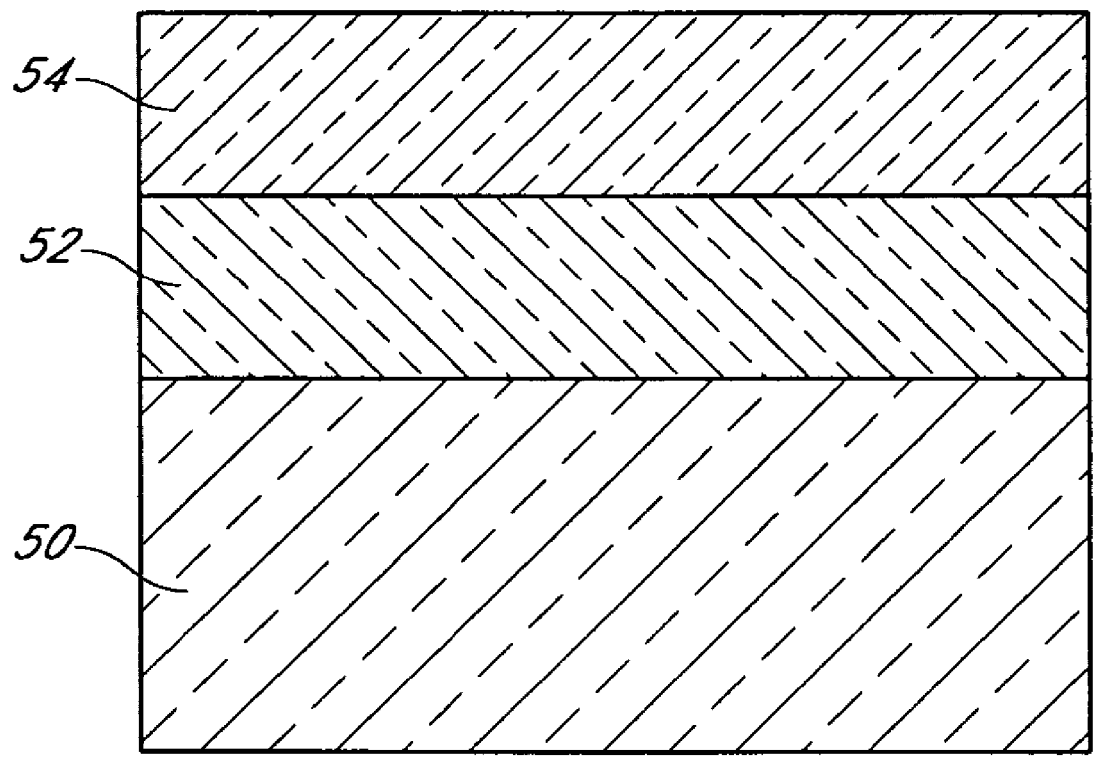
FIG. 6 is a cross-sectional view of a partially formed integrated circuit comprising a release layer and a single-crystal silicon layer formed over a carrier substrate.

An exemplary method of using a wafer transfer technique to form a DRAM cell is described as follows. As illustrated in FIG. 6, a release layer 52 and a single-crystal silicon layer 54 are formed over a carrier substrate 50. In an exemplary embodiment, the carrier substrate 50 comprises a silicon wafer. In an exemplary embodiment, the release layer 52 comprises a silicon germanium layer, although in an alternative embodiment the release layer 52 comprises a portion of the single-crystal silicon layer that has been implanted with hydrogen ions. In yet another embodiment, the release layer comprises silicon oxide formed by implanting oxygen through the upper silicon layer. In yet another embodiment, a silicon-on-insulator wafer is used for the carrier substrate 50 and the release layer 52. In embodiments wherein a hydrogen implantation technique is not used, the release layer 52 is accessible by performing a wet etch through channels or large holes formed around the periphery of the memory cell array. For example, in one embodiment, a silicon germanium release layer is accessed via a "moat" that is etched around the array down to the level of the release layer. In such embodiments, the silicon germanium is then selectively etched from the side to separate the carrier substrate 50.

Figure 7:
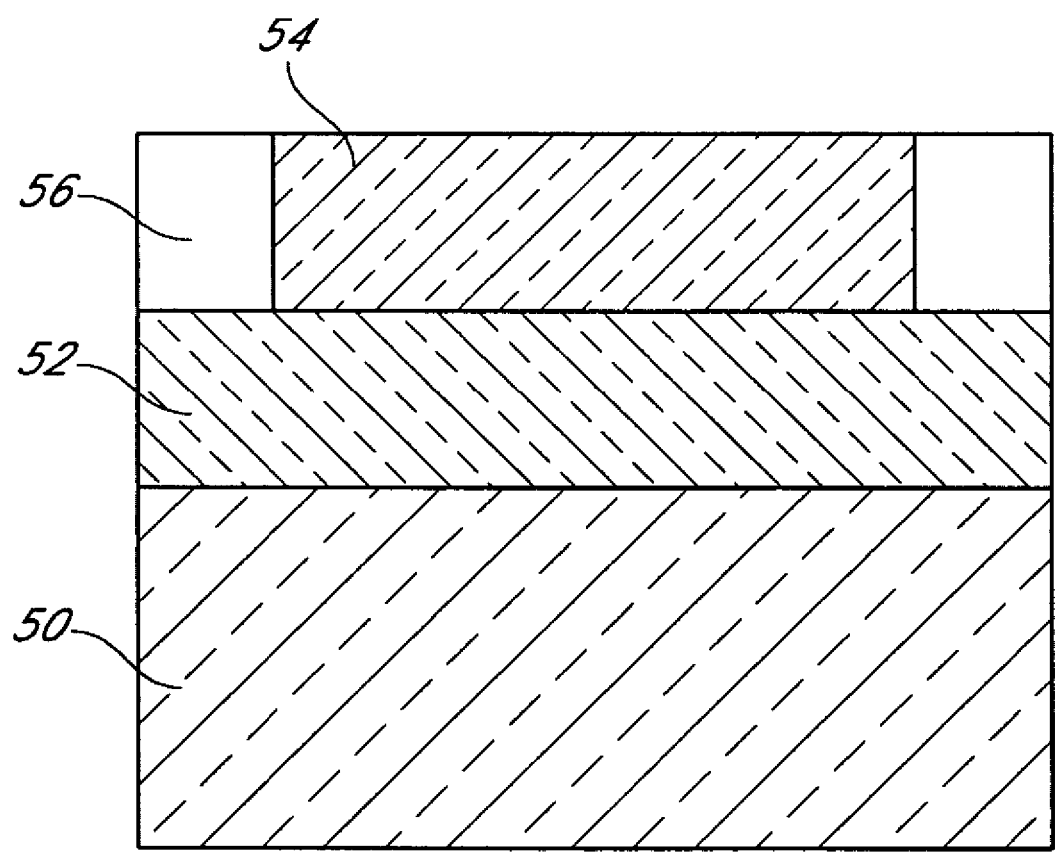
FIG. 7 is a cross-sectional view of the partially formed integrated circuit of FIG. 6, further comprising shallow trench isolation structures formed in the single-crystal silicon layer.
Figure 8:
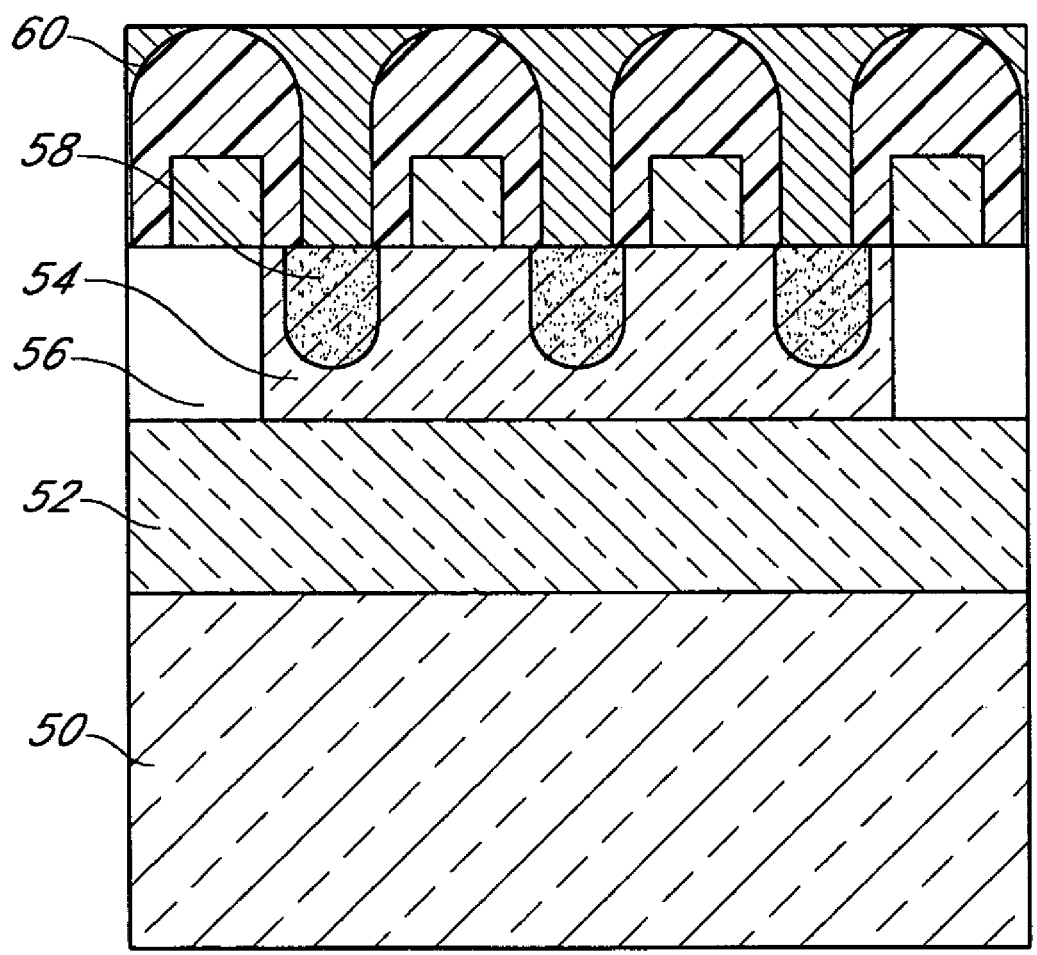
FIG. 8 is a cross-sectional view of the partially formed integrated circuit of FIG. 7, further comprising transistor structures formed over the single-crystal silicon layer.

As illustrated in FIG. 7, shallow trench isolation structures 56 are formed in the single-crystal silicon layer 54. Optionally, large photo alignment marks are also formed in the release layer to assist in aligning substrates during subsequent pattern transfer techniques. Subsequently, as illustrated in FIG. 8, after the shallow trench isolation structures 56 are formed, transistor structures 60 are formed over the single-crystal silicon layer 54. Transistor structures 60 are illustrated in FIG. 8 as lateral metal-oxide-semiconductor field effect transistors. This includes formation of doped implant regions 58 in the single-crystal silicon layer 54.

Figure 9A:
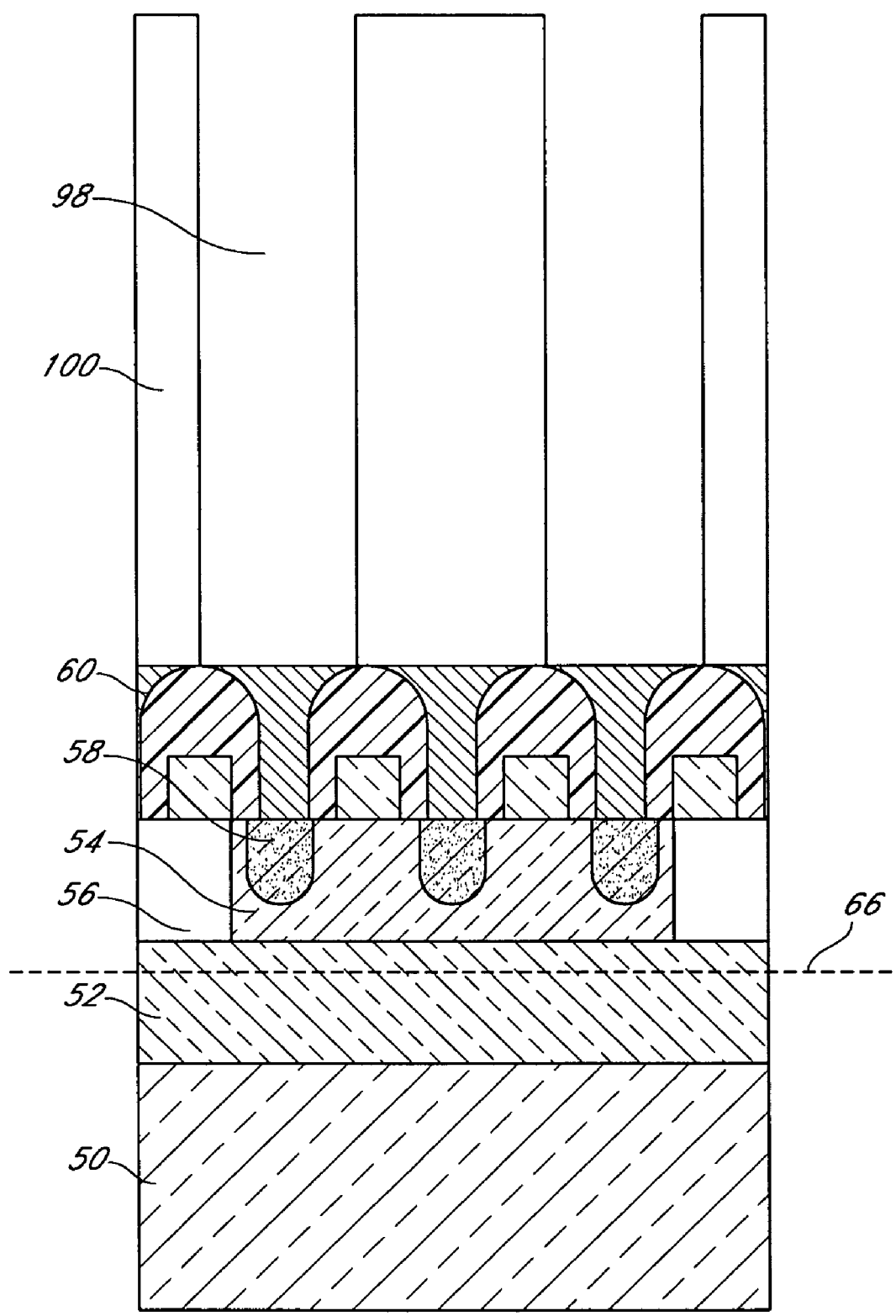
FIG. 9A is a cross-sectional view of the partially formed integrated circuit of FIG. 8, further comprising a plurality of container structures formed over the transistor structures, wherein the container structures are used in the formation of double-sided capacitors.

A double-sided capacitor is then formed over the transistor structures 60. As illustrated in FIG. 9A, a plurality of container structures 98 are formed in a sacrificial layer 100 that is deposited over the transistor structures 60. In an exemplary embodiment, the container structures 98 are spaced apart from each other by between about 60 nm and about 150 nm. The recesses are formed using mask and etch techniques, such as using an anisotropic etch method. An exemplary anisotropic etch method is reactive ion etching. Each recess is preferably etched to a depth of between about 4000 Å and about 13000 Å, more preferably between about 8000 Å and about 10000 Å, vertically into the sacrificial layer 100. The depth, shape and other properties of the recesses are altered for different applications without departing from the scope of the present teachings.

Figure 9B:
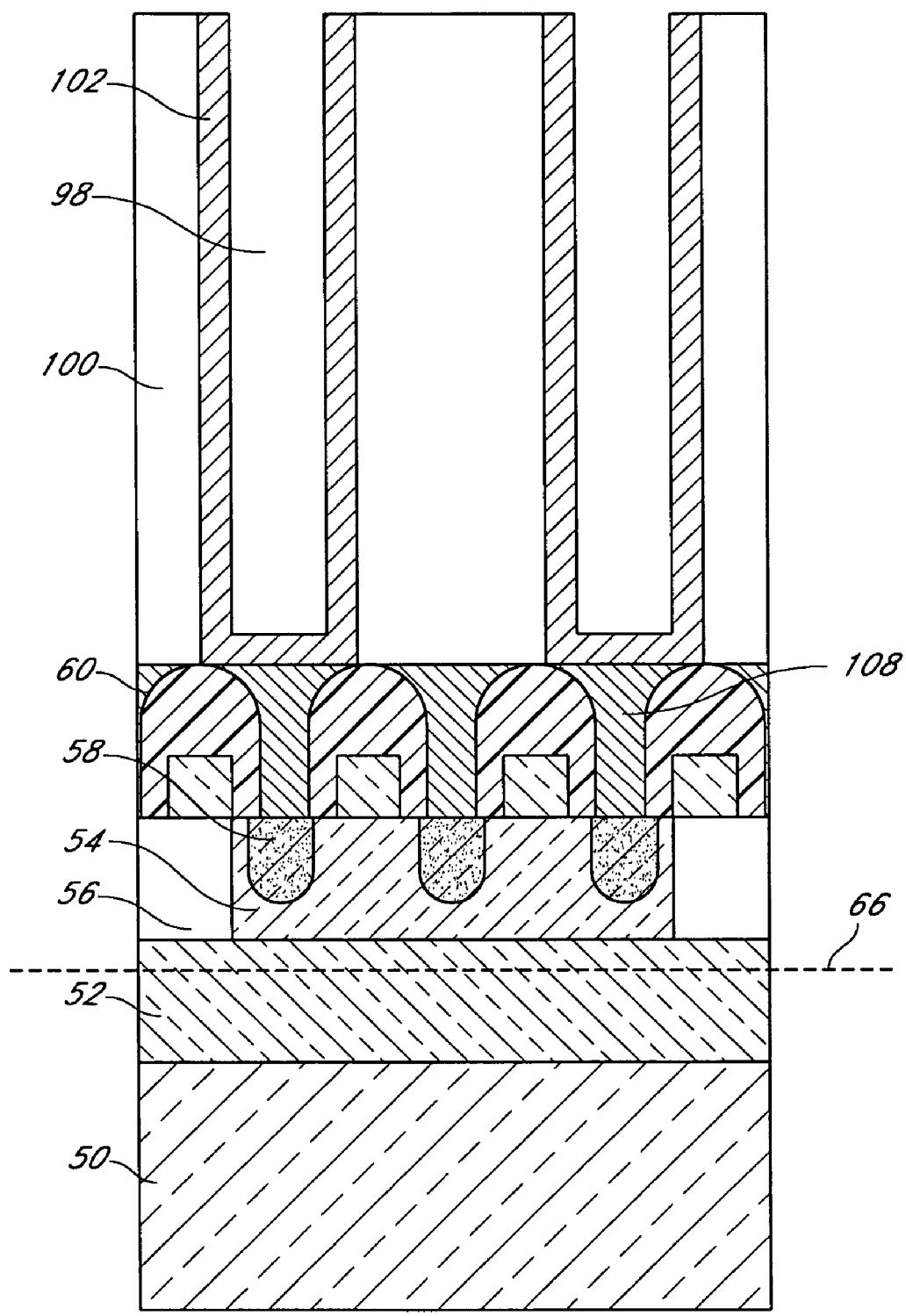
FIG. 9B is a cross-sectional view of the partially formed integrated circuit of FIG. 9A, further comprising lower electrode structures formed within the container structures.

Referring now to FIG. 9B, a lower electrode 102 is formed within the container structures 98. The lower electrode 102 comprises an electrically conductive material, such as polycrystalline silicon, titanium nitride, and elemental metals and metal alloys. In an exemplary embodiment, the thickness of the lower electrode 102 leaves room within the container structure 98 for subsequent conformal capacitor dielectric and upper electrode layers. Preferably the lower electrode is between about 100 Å and about 500 Å thick, more preferably between about 100 Å and about 200 Å thick. Conformal deposition, fill and polish can be used to form the bottom electrodes 102, as will be appreciated by an ordinarily-skilled artisan.

Figure 9C:
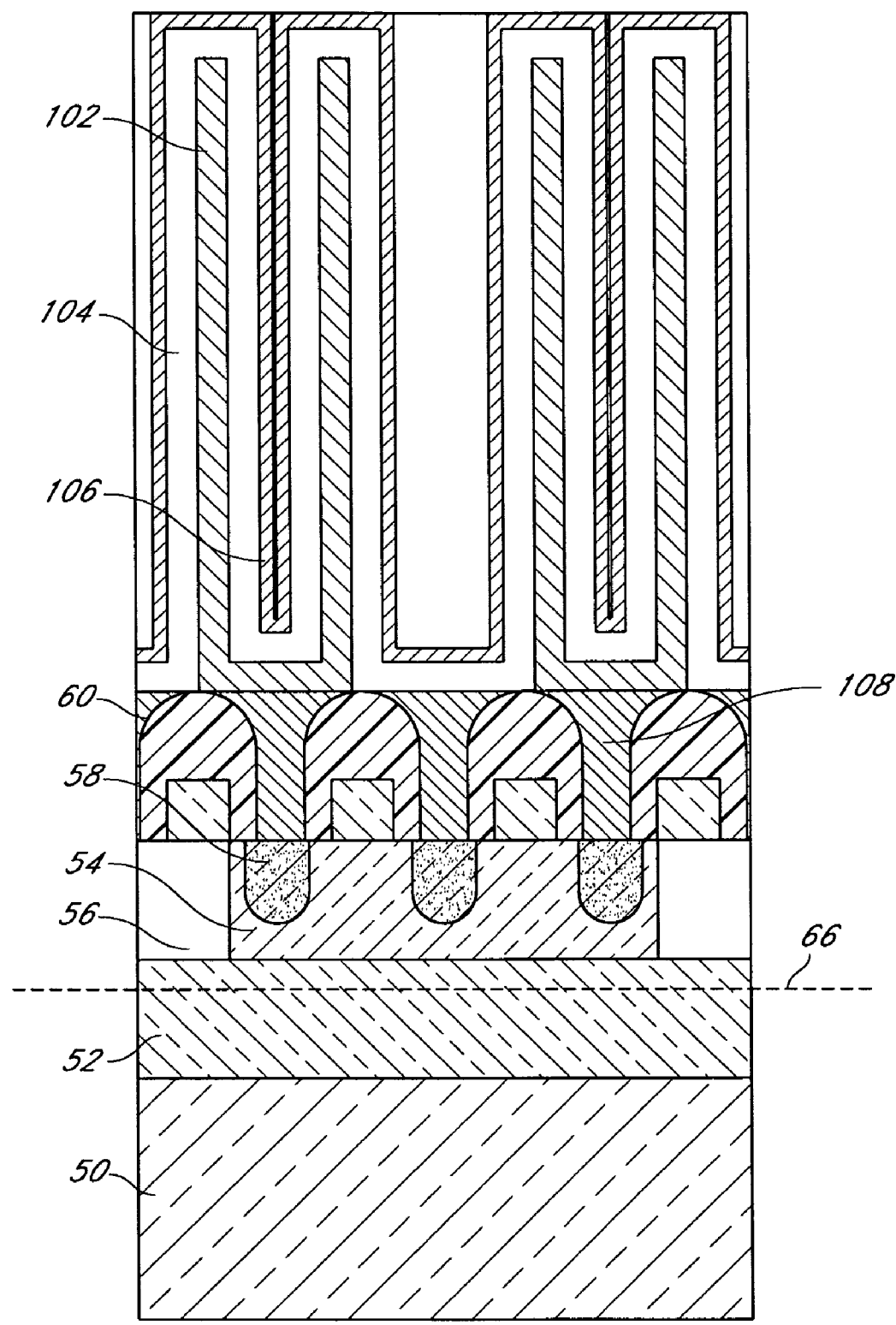
FIG. 9C is a cross-sectional view of the partially formed integrated circuit of FIG. 9B after removal of the structural layer defining the containers and deposition of a dielectric layer and upper electrode structures over the dielectric layer.

As illustrated in FIG. 9C, the sacrificial layer 100 is removed, for example using an isotropic etchant. In an exemplary embodiment, a dilute hydrofluoric (HF) acid solution is used to etch the sacrificial layer 100, wherein the HF acid solution has an HF concentration by weight between about 2% and about 15%. The removal of the sacrificial layer 100 exposes a greater surface area of the lower electrode before the deposition of a conformal capacitor dielectric 104. The dielectric 104 is deposited over the surface of the structure, including over the lower electrode 102 and the area formerly occupied by the sacrificial layer 100. Various materials are usable for the capacitor dielectric 104; examples include nonconductive metal oxides, metal nitrides and silicon oxides. In one embodiment, the capacitor dielectric is a transitional metal oxide, more preferably an early transitional metal oxide. In many high capacity DRAM structures, tantalum pentoxide ($Ta_2O_5$) is used as the capacitor dielectric 104. Tantalum pentoxide is easily deposited by chemical vapor deposition (CVD) with good step coverage, and has a high delectric constant of between about 20 and about 25. Other transitional metal oxides which are usable include hafnium oxide ($HfO_2$) and zirconium oxide ($ZrO_2$). The thickness of the capacitor dielectric 104 is selected to leave room for the upper electrode, but the thickness is generally between about 10 Å and about 500 Å, depending on the material and the capacitance called for by a particular application. Exemplary techniques for depositing the capacitor dielectric 104 include CVD and deposition of a metal followed by oxidization.

Still referring to FIG. 9C, deposition of an upper electrode 106 is also illustrated. In an exemplary embodiment, the same material that was used for the lower electrode 102 is used for the upper electrode 106. Other preferred materials for the upper electrode 106 include tungsten silicide, elemental metal, or metal alloys. The thickness of the upper electrode varies depending on the application. In a modified embodiment, the upper electrode 106 comprises several thin layers of conductive materials, even though upper electrode 106 is illustrated in FIG. 9C as a common reference electrode. A contact 108 is provided between the doped implant regions 58 and the lower electrode 102.

In other embodiments, capacitor configurations other than the double sided capacitor of FIG. 9C are used. For example, in a modified embodiment a capacitor having three distinct electrode surfaces that are parallel to each other is formed. An example of such a structure is a capacitor having fins. In another embodiment, a capacitor having a bottom electrode having and inner surface and an outer surface is formed. In such embodiments, the capacitor dielectric and an upper electrode extend over each of the inner and outer surfaces of the bottom electrode.

Figure 10:
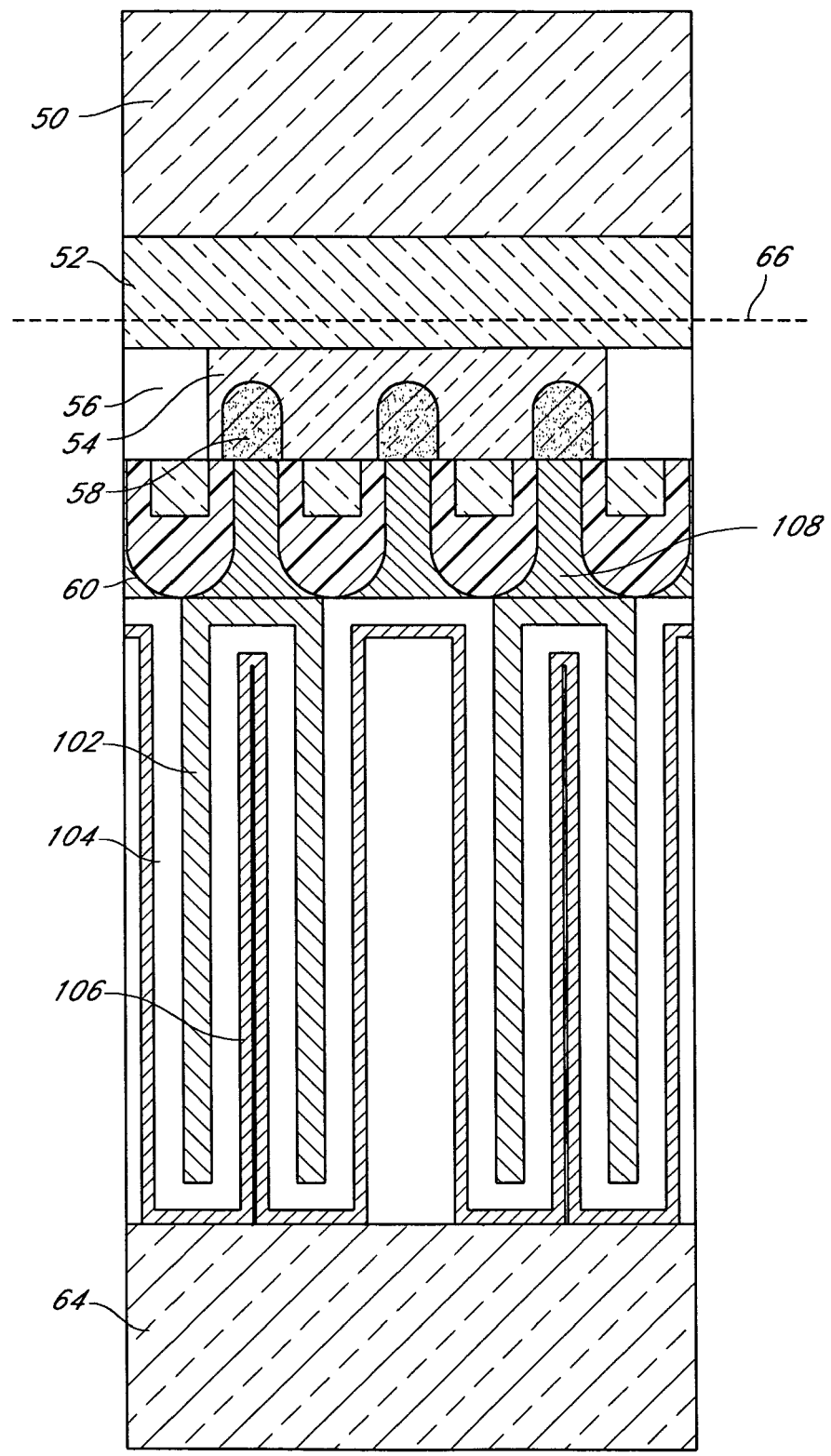
FIG. 10 is a cross-sectional view of the partially formed integrated circuit of FIG. 9 after performing a pattern transfer technique to move the structure onto a host substrate.
Figure 11:
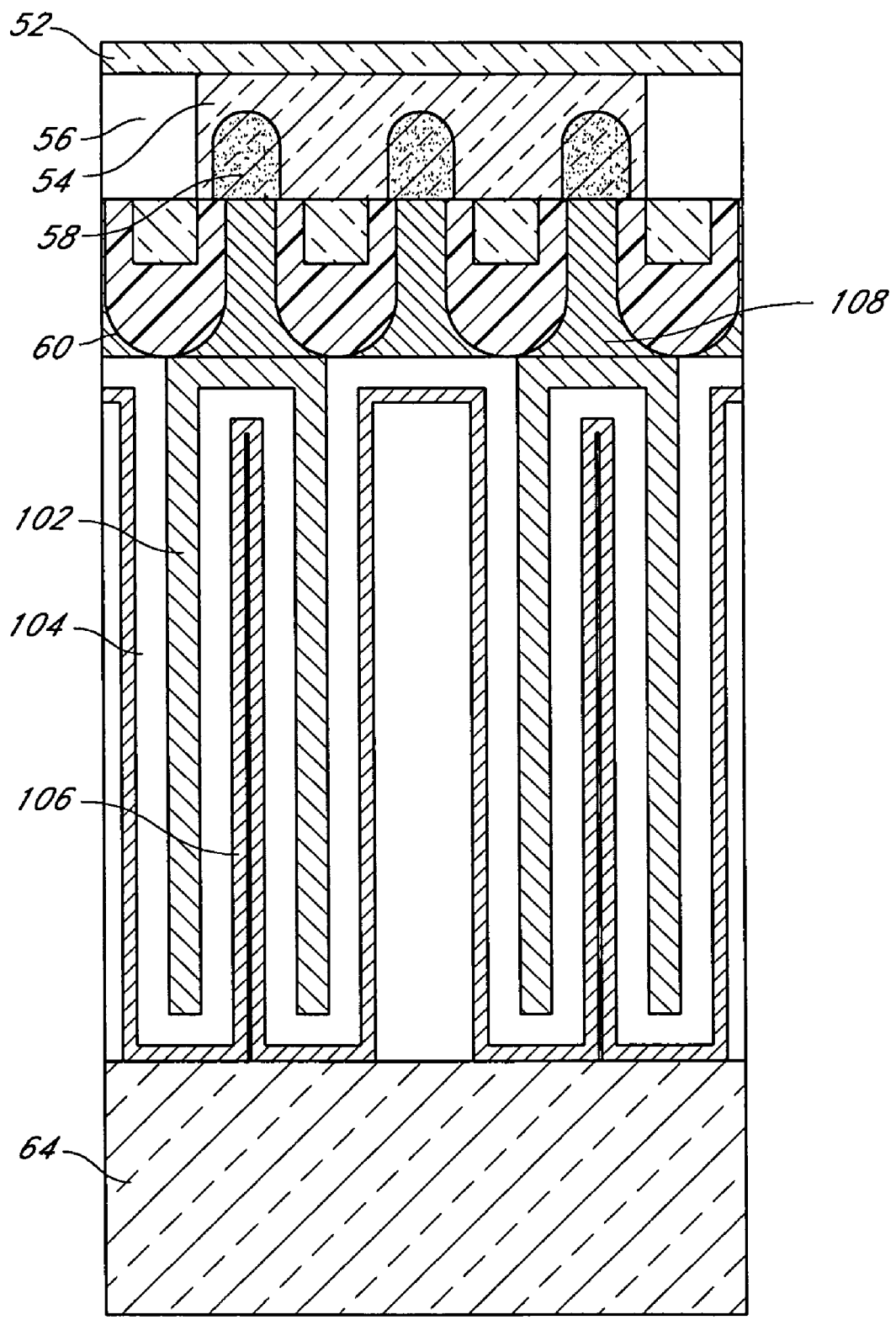
FIG. 11 is a cross-sectional view of the partially formed integrated circuit of FIG. 10 after separating the carrier substrate.

In an exemplary embodiment, after the structure illustrated in FIG. 9C is formed, a pattern transfer technique is performed. As illustrated in FIG. 10, the partially formed integrated circuit illustrated in FIG. 9C is inverted and bonded to a host substrate 64. The alignment onto the host substrate is not critical for the bonding process. For example, in one embodiment a trench etched into oxide between dies or outside dies is used as an alignment feature. After the bond is provided with the host substrate 64, for example by soldering, the carrier substrate 50 is separated by delamination along the line formed by the hydrogen implantation process or by selectively etching the release layer 52. The moats referred to above can facilitate more uniform removal of the release layer 52 across the wafer. The resulting structure is illustrated in FIG. 11.

Figure 12:
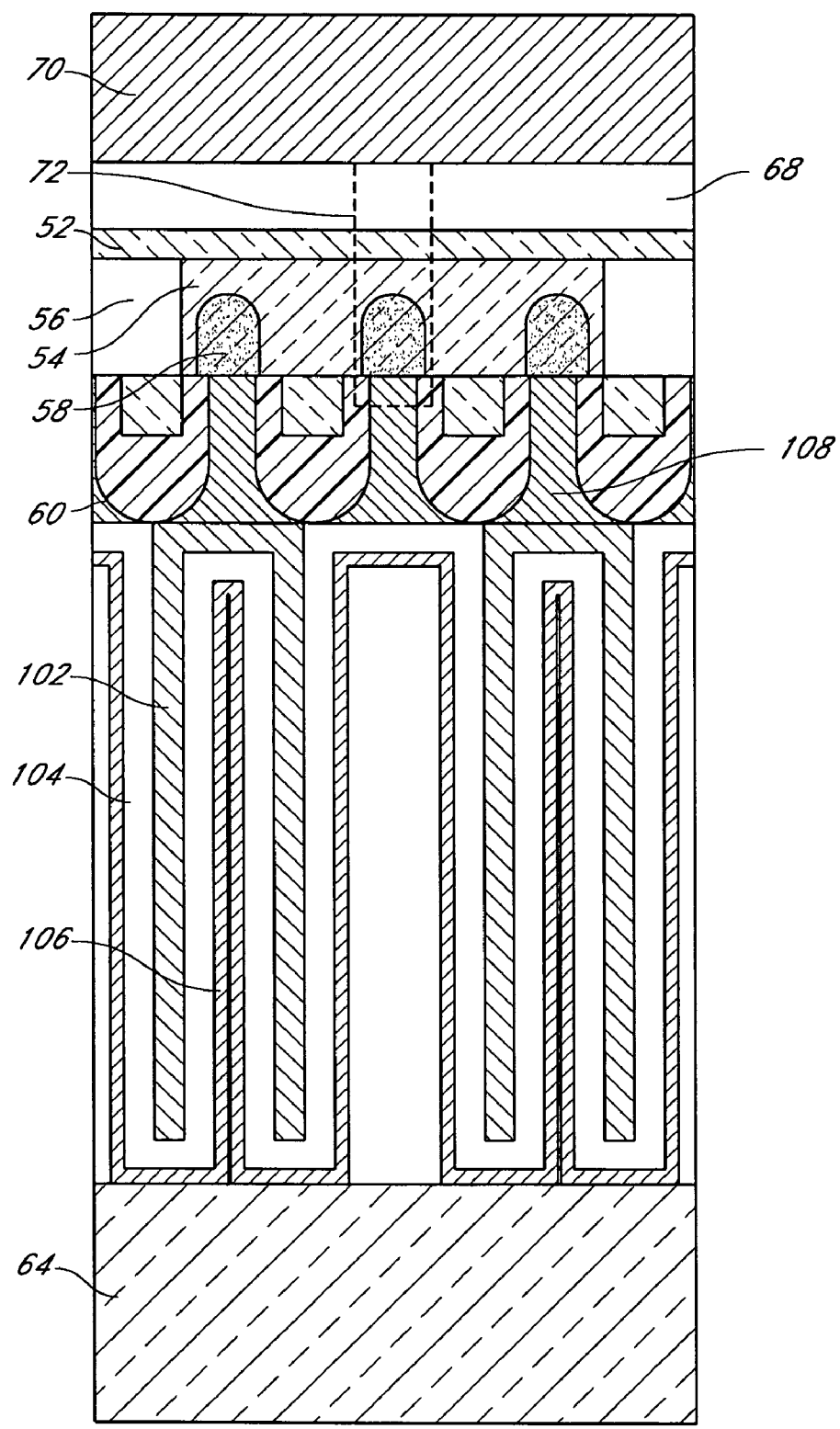
FIG. 12 is a cross-sectional view of the partially formed integrated circuit of FIG. 11 after formation of a digit line thereover.

After the pattern transfer technique is performed, additional features are formed in the planar region overlying the planar surface formed by the silicon layer 54. For example, as illustrated in FIG. 12, an insulation layer 68 is provided to electrically isolate a subsequently-formed digit line 70. Exemplary materials used to form the digit line 70 include, but are not limited to copper, tungsten, titanium, aluminum, gold, nickel and cobalt. In such embodiments, a via 72 is etched through the insulation layer 68 and the silicon layer 54 to provide an electrical connection from the digit line to a source region of the transistor structure. In an exemplary embodiment, the etched via 72 is filled with a conductive material, such as polycrystalline silicon or tungsten, in a damascene process. In one embodiment, the vias have a dimension between about 0.1 µm and about 1.0 µm. In another embodiment, the vias have a dimension between about 0.2 µm and about 0.7 µm. In yet another embodiment, the vias have a dimension between about 0.3 µm and about 0.5 µm. In such embodiments, the formation of the digit line contacts is simplified as compared to conventional structures because the vias 72 are not required to reach through the entire height of the capacitor.

Figure 13:
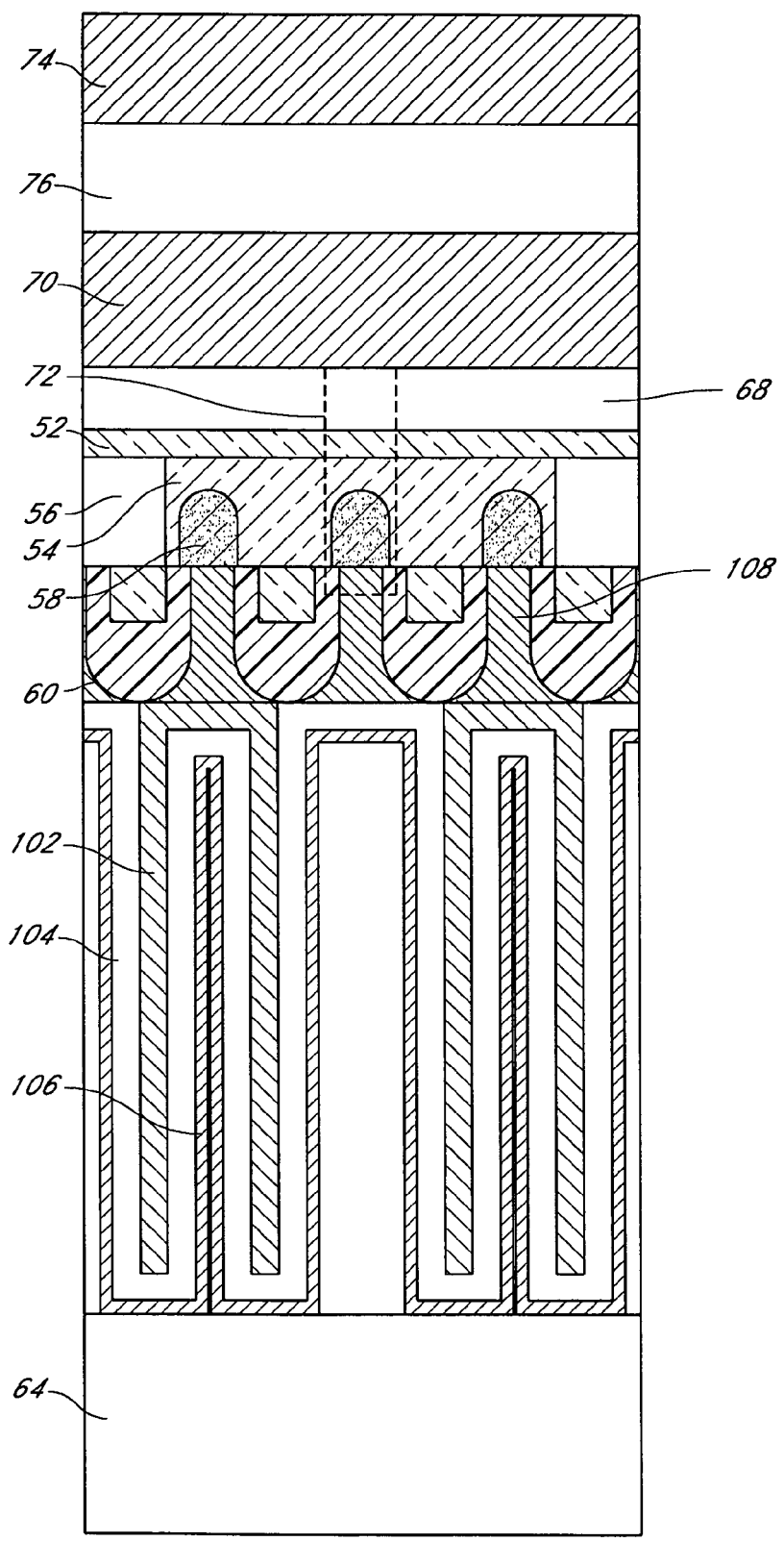
FIG. 13 is a cross-sectional view of the partially formed integrated circuit of FIG. 12 after formation of a metal interconnect layer thereover.

As illustrated in FIG. 13, a patterned layer of metal interconnects 74 are formed over the digit lines 70, and are separated from the digit lines 70 by an intervening insulation layer 76. The contacts 108 between the doped implant regions 58 and the capacitor lower electrode 102 is provided between adjacent transistor structures 60.

FIGS. 14A through 14G illustrate a schematic process flow that includes the following process operations. In process operation (a), a release layer 78 and a single-crystal silicon layer 80 are formed on a carrier substrate 76. In process operation (b), transistor devices are formed in the single-crystal silicon layer 80, thus resulting in a transistor layer 82 positioned over the release layer. In process operation (c), a word line layer 84 is deposited over the transistor layer 82, wherein the word line layer 84 includes an array of word lines and conductive plugs. In process operation (d), a stacked capacitor structure 86 having a folding three-dimensional shape more complicated than simple trench capacitors is positioned over the word line layer 84. In process operation (e), the resulting structure is then transferred to a host substrate 88 where the carrier substrate is removed along separation line 96. In process operation (f), an insulator layer 90 and an array of digit lines 92 are formed over the planar surface produced after removal of the carrier substrate 76. In process operation (g), a patterned layer of metal interconnects 94 are formed over the array of digit lines 92.

Certain of the processes described herein allow production of a reverse trench capacitor DRAM cell having advantages over the prior art. For example, the digit lines 70 are formed in the planar region over the cell after formation of the transistor and capacitor devices, and therefore are not subjected to the high temperature processes used in the fabrication of those devices. For example, high temperature processing steps are used in the fabrication of certain high dielectric constant materials present in certain capacitor devices, such as materials having a dielectric constant greater than 7. Additionally, certain of these processes facilitate high-yield fabrication of vertical pillar transistors for use in memory cells as small as 4 $F^2$ without the use of expensive alignment techniques for the pattern transfer process. Furthermore, the vias 72 used to contact the transistor device with the digit line 70 are shorter and also have a low aspect ratio than those used in conventional memory cells, and are therefore easily formed. Similarly, certain of the technique disclosed herein can be used to form devices with reduced digit line capacitance. For example, FIG. 4 illustrates a bit line having increased volume without reducing the volume of the isolation trenches 26 between the bit lines. As described herein, this presents significant advantages as compared to conventional structures wherein bit lines are buried in trenches having oxide liners.

SCOPE OF THE INVENTION

While the foregoing detailed description discloses several embodiments of the present invention, it should be understood that this disclosure is illustrative only and is not limiting of the present invention. It should be appreciated that the specific configurations and operations disclosed can differ from those described above, and that the methods described herein can be used in contexts other than memory cells.

We claim:

1. A method of fabricating a memory array, the method comprising:
    forming at least three vertically stacked doped semiconductor layers of alternating conductivity type on a carrier substrate;
    forming a plurality of digit lines for the memory array separated by an insulating material, wherein the digit lines are arrayed over the vertically stacked doped semiconductor layers on the carrier substrate;
    bonding at least a portion of a structure formed on the carrier substrate to a host substrate, wherein the structure comprises the vertically stacked doped semiconductor layers and the plurality of digit lines; and
    separating a portion of the carrier substrate from the host substrate while leaving the structure on the host substrate.

2. The method of claim 1, further comprising performing a chemical mechanical planarization process on a semiconductor surface, wherein the semiconductor surface is exposed by separating the portion of the carrier substrate from the host substrate.

3. The method of claim 1, further comprising implanting hydrogen ions in a region in one of the at least three vertically stacked doped semiconductor layers, wherein the carrier substrate is separated in the region of hydrogen ion implantation.

4. The method of claim 1, wherein the at least three vertically stacked doped semiconductor layers comprises a $p^-$ doped layer positioned between an $n^+$ doped layer and an $n^-$ doped layer.

5. The method of claim 1, wherein one of the at least three vertically stacked doped semiconductor layers comprises doped silicon.

6. The method of claim 1, wherein the plurality of trenches have feature size F is between about 50 μm and about 150 μm.

7. The method of claim 1, wherein the digit lines comprise a material selected from the group consisting of tungsten, titanium, nickel and cobalt.

8. The method of claim 1, wherein the insulating material is an oxide material.

9. The method of claim 1, further comprising inverting the at least three vertically stacked doped semiconductor layers after bonding at least a portion of the structure formed on the carrier substrate to a host substrate.

10. The method of claim 1, further comprising forming a layer of insulating material over the vertically stacked doped semiconductor layers and the plurality of digit lines prior to the bonding.

11. The method of claim 1, further comprising:
    etching a plurality of trenches through at least two of the doped semiconductor layers; and
    depositing an insulating material into the plurality of trenches to form a plurality of transistor pillars before bonding and separating.

12. The method of claim 11, wherein the plurality of trenches are etched to a depth above a separation line along which the carrier substrate is separated.

13. The method of claim 11, wherein etching a plurality of trenches through at least two of the doped semiconductor layers comprises etching a plurality of trenches through at least three of the doped semiconductor layers before the carrier substrate is separated.

14. The method of claim 11, wherein the plurality of trenches are etched to a depth below a separation line along which the carrier substrate is separated.

15. A method comprising:
    forming a plurality of at least partially fabricated vertical transistor structures on a carrier substrate;
    forming a plurality of digit lines over the at least partially fabricated vertical transistor structures;
    separating the digit lines and the at least partially fabricated vertical transistor structures from the carrier substrate;
    bonding the digit lines and the at least partially fabricated vertical transistor structures to a host substrate, such that the digit lines are positioned between the host substrate and the at least partially fabricated vertical transistor structures.

16. The method of claim 15, wherein the at least partially fabricated vertical transistor structures comprise a transistor pillars separated by a plurality of orthogonally arrayed trenches.

17. The method of claim 15, further comprising performing a chemical mechanical planarization process on a semiconductor surface, wherein the semiconductor surface is exposed by separating the portion of the carrier substrate from the host substrate.

18. The method of claim 15, further comprising implanting hydrogen ions in a region in one of the plurality of at least partially fabricated vertical transistor structures, wherein the carrier substrate is separated in the region of hydrogen ion implantation.

19. The method of claim 15, wherein the plurality of digit lines comprise a material selected from the group consisting of copper, aluminum, gold, nickel and cobalt.

20. The method of claim 15, further comprising forming a complete memory array after bonding and separating, wherein the memory array comprises a plurality of transistors formed from the partially fabricated vertical transistor structures and the plurality of digit lines.

* * * * *

UNITED STATES PATENT AND TRADEMARK OFFICE
CERTIFICATE OF CORRECTION

PATENT NO. : 7,776,715 B2  Page 1 of 1
APPLICATION NO. : 11/189945
DATED : August 17, 2010
INVENTOR(S) : David H. Wells et al.

It is certified that error appears in the above-identified patent and that said Letters Patent is hereby corrected as shown below:

In column 12, line 29, in Claim 14, delete "claim 11" and insert -- claim 13 --, therefor.

Signed and Sealed this

Twenty-sixth Day of October, 2010

David J. Kappos
*Director of the United States Patent and Trademark Office*